United States Patent
Moon

(10) Patent No.: US 9,755,279 B2
(45) Date of Patent: Sep. 5, 2017

(54) BATTERY PROTECTION CIRCUIT MODULE AND BATTERY PACK INCLUDING THE SAME

(71) Applicant: Samsung SDI Co., Ltd., Yongin-si, Gyeonggi-do (KR)

(72) Inventor: Dae-Yon Moon, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 278 days.

(21) Appl. No.: 14/595,001

(22) Filed: Jan. 12, 2015

(65) Prior Publication Data

US 2015/0263389 A1 Sep. 17, 2015

(30) Foreign Application Priority Data

Mar. 14, 2014 (KR) ........................ 10-2014-0030471

(51) Int. Cl.
*H01M 10/052* (2010.01)
*H01M 10/42* (2006.01)
*H01M 2/10* (2006.01)
*H01M 2/34* (2006.01)
*H01M 2/30* (2006.01)
*H05K 3/40* (2006.01)

(52) U.S. Cl.
CPC ....... *H01M 10/425* (2013.01); *H01M 2/1061* (2013.01); *H01M 2/30* (2013.01); *H01M 2/348* (2013.01); *H01M 10/4207* (2013.01); *H05K 3/403* (2013.01); *H01M 2200/10* (2013.01); *H05K 3/4092* (2013.01); *H05K 2201/0397* (2013.01); *H05K 2201/09145* (2013.01); *H05K 2201/10037* (2013.01)

(58) Field of Classification Search
CPC ........................ H01M 10/425; H01M 10/4257
See application file for complete search history.

(56) References Cited

U.S. PATENT DOCUMENTS

2011/0268996 A1 11/2011 Lee
2012/0121939 A1 5/2012 Yoo
(Continued)

FOREIGN PATENT DOCUMENTS

| KR | 10-1127611 B1 | 3/2012 |
|---|---|---|
| KR | 10-2012-0053458 A | 5/2012 |
| KR | 10-2013-0006279 A | 1/2013 |

*Primary Examiner* — Olatunji Godo
(74) *Attorney, Agent, or Firm* — Knobbe Martens Olson & Bear LLP

(57) ABSTRACT

A battery protection circuit module and battery pack including the same are disclosed. In one aspect, the battery pack includes a first battery cell including a pair of first electrode tabs, a battery protection circuit module, and a frame accommodating the first battery cell and the battery protection circuit module. The battery protection circuit module includes a printed circuit board (PCB) having a first recess formed in a first side thereof and a pair of first tabs that are separated from each other, wherein each of the first tabs at least partially overlaps the first recess. The battery protection circuit module also includes a first temperature protection device having one end thereof electrically connected to one of the first tabs and the other end thereof electrically connected to the other first tab and a pair of first connection units respectively electrically connected to the first electrode tabs.

16 Claims, 7 Drawing Sheets

(56) References Cited

U.S. PATENT DOCUMENTS

2012/0270074 A1* 10/2012 Koh .................... H01M 2/0212
  429/7
2013/0011700 A1*  1/2013 Park ................... H01M 2/1077
  429/7

* cited by examiner

BATTERY PROTECTION CIRCUIT MODULE AND BATTERY PACK INCLUDING THE SAME

INCORPORATION BY REFERENCE TO ANY PRIORITY APPLICATIONS

This application claims the benefit of Korean Patent Application No. 10-2014-0030471, filed on Mar. 14, 2014, in the Korean Intellectual Property Office, the disclosure of which is incorporated herein in its entirety by reference.

BACKGROUND

Field

The described technology generally relates to a battery protection circuit module and a battery pack including the same.

Description of the Related Technology

The use of portable computers such as tablet personal computers (PC) and laptop computers which draw power from batteries is rapidly increasing due to the development of wireless Internet and communication technologies. In general, since portable computers are small, easy to carry, and highly mobile, portable computers are widely used for both business and personal uses. Portable computers include built-in battery packs so that they can be used away from immobile power sources such as electrical outlets, increasing their mobility. Battery packs may therefore include secondary batteries that can be repeatedly charged and discharged to enhance the portability of the electrical devices using the battery packs.

SUMMARY OF CERTAIN INVENTIVE ASPECTS

One inventive aspect is a battery protection circuit module having a simplified manufacturing processes and a battery pack including the same.

Another aspect is a battery protection circuit module including a printed circuit board (PCB) having a first recess cut inward in one side thereof, a pair of first tabs that are separately positioned, each of the pair of first tabs having a part that overlaps the PCB, and each of the pair of first tabs having a remainder that is positioned in the first recess, and a first temperature protection device having one end thereof electrically connected to one of the pair of first tabs and the other end thereof electrically connected to the other one of the pair of first tabs.

The PCB has a second recess cut inward in the other side thereof. The battery protection circuit module may further include a pair of second tabs that are separately positioned, each of the pair of second tabs having a part that overlaps the PCB, and each of the pair of second tabs having a remainder that is positioned in the second recess and a second temperature protection device having one end thereof electrically connected to one of the pair of second tabs and the other end thereof electrically connected to the other one of the pair of second tabs.

Another aspect is a battery protection circuit module including a PCB, a pair of first tabs that are separately positioned, each of the pair of first tabs having a part that overlaps the PCB on one side of the PCB, and each of the pair of first tabs having a remainder that protrudes to the outside of the PCB, and a first temperature protection device having one end thereof electrically connected to one of the pair of first tabs and the other end thereof electrically connected to the other one of the pair of first tabs.

The battery protection circuit module may further include a pair of second tabs that are separately positioned, each of the pair of second tabs having a part that overlaps the PCB on the other side of the PCB, and each of the pair of second tabs having a remainder that protrudes to the outside of the PCB and a second temperature protection device having one end thereof electrically connected to one of the pair of second tabs and the other end thereof electrically connected to the other one of the pair of second tabs.

The pair of first tabs may include nickel (Ni).

The first temperature protection device may be welded and connected to the pair of first tabs.

The part of each of the pair of first tabs may be arranged on one surface of the PCB and the first temperature protection device may be welded and connected to a surface of the pair of first tabs that contacts the one surface of the PCB among both surfaces of each of the pair of first tabs.

The battery protection circuit module may further include a pair of first connection units that are arranged on the one surface of the PCB, to which a pair of first electrode tabs of a battery cell may be welded, and that are electrically connected to the pair of first tabs.

The battery protection circuit module may further include electronic devices arranged on the other surface of the PCB.

The pair of second tabs may include Ni.

The second temperature protection device may be welded and connected to the pair of second tabs.

The part of each of the pair of second tabs may be arranged on one surface of the PCB and the second temperature protection device may be welded and connected to a surface of the pair of second tabs that contacts the one surface of the PCB among both surfaces of each of the pair of second tabs.

The battery protection circuit module may further include a pair of first connection units that are arranged on the one surface of the PCB, to which a pair of first electrode tabs of one battery cell are welded, and that are electrically connected to the pair of first tabs and a pair of second connection units to which the pair of second electrode tabs of the other battery cell are welded and that are electrically connected to the pair of second tabs.

Another aspect is a battery pack including a first battery cell having a pair of first electrode tabs, a battery protection circuit module, and a frame for accommodating the first battery cell and the battery protection circuit module. The battery protection circuit module includes a PCB having a first recess cut inward in one side thereof, a pair of first tabs that are separately positioned, each of the pair of first tabs having a part that is arranged on one surface of the PCB to overlap the PCB, and each of the pair of first tabs having a remainder that is positioned in the first recess, a first temperature protection device having one end thereof electrically connected to one of the pair of first tabs and the other end thereof electrically connected to the other one of the pair of first tabs and welded and connected to a surface that contacts the one surface of the PCB among both surfaces of each of the pair of first tabs, and a pair of first connection units that are arranged on the one surface of the PCB, to which the pair of first electrode tabs of the first battery cell are welded, and that are electrically connected to the pair of first tabs.

The PCB has a second recess cut inward in the other side thereof. The battery pack further includes a second battery cell having a pair of second electrode tabs. The frame accommodates the second battery cell. The battery protection circuit module may further include a pair of second tabs that are separately positioned, each of the pair of second tabs having a part that is arranged on the one surface of the PCB to overlap the PCB, and each of the pair of second tabs having a remainder that is positioned in the second recess, a second temperature protection device having one end thereof electrically connected to one of the pair of second tabs and the other end thereof electrically connected to the other one of the pair of second tabs and welded and connected to a surface that contacts the one surface of the PCB among both surfaces of each of the pair of second tabs, and a pair of second connection units that are arranged on the one surface of the PCB, to which the pair of second electrode tabs of the second battery cell are welded, and that are electrically connected to the pair of second tabs.

Another aspect is a battery pack including a first battery cell having a pair of first electrode tabs, a battery protection circuit module, and a frame for accommodating the first battery cell and the battery protection circuit module. The battery protection circuit module includes a PCB, a pair of first tabs that are separately positioned, each of the pair of first tabs having a part that is arranged on one surface of the PCB to overlap the PCB on one side of the PCB, and each of the pair of first tabs having a remainder that protrudes to the outside of the PCB, a first temperature protection device having one end thereof electrically connected to one of the pair of first tabs and the other end thereof electrically connected to the other one of the pair of first tabs and welded and connected to a surface that contacts the one surface of the PCB among both surfaces of each of the pair of first tabs, and a pair of first connection units that are arranged on the one surface of the PCB, to which the pair of first electrode tabs of the first battery cell are welded, and that are electrically connected to the pair of first tabs.

The battery pack further includes a second battery cell having a pair of second electrode tabs. The frame accommodates the second battery cell. The battery protection circuit module may further include a pair of second tabs that are separately positioned, each of the pair of second tabs having a part that is arranged on the one surface of the PCB to overlap the PCB on the other side of the PCB, and each of the pair of second tabs having a remainder that protrudes to the outside of the PCB, a second temperature protection device having one end thereof electrically connected to one of the pair of second tabs and the other end thereof electrically connected to the other one of the pair of second tabs and welded and connected to a surface that contacts the one surface of the PCB among both surfaces of each of the pair of second tabs, and a pair of second connection units that are arranged on the one surface of the PCB, to which the pair of second electrode tabs of the second battery cell are welded, and that are electrically connected to the pair of second tabs.

The pair of first tabs may include Ni. The pair of second tabs may include Ni.

The battery protection circuit module may further include electronic devices arranged on the other surface of the PCB.

Another aspect is a battery pack, comprising a first battery cell including a pair of first electrode tabs; a battery protection circuit module; and a frame accommodating the first battery cell and the battery protection circuit module, wherein the battery protection circuit module comprises: a printed circuit board (PCB) having a first recess formed in a first side thereof; a pair of first tabs that are separated from each other, wherein each of the first tabs at least partially overlaps the first recess; a first temperature protection device having one end thereof electrically connected to one of the first tabs and the other end thereof electrically connected to the other first tab; and a pair of first connection units respectively electrically connected to the first electrode tabs.

Each of the first tabs can be formed at least partially of nickel (Ni). The first temperature protection device can be welded to the first tabs. Each of the first tabs can have a facing surface facing an one surface of the PCB, the first temperature protection device can be welded to the facing surfaces of the first tabs, and the first connection units can be arranged on the one surface of the PCB. The battery pack can further comprise a second battery cell including a pair of second electrode tabs, wherein the PCB has a second recess formed in a second side thereof opposing the first side, wherein the frame accommodates the second battery cell, and wherein the battery protection circuit module further comprises: a pair of second tabs that are separated from each other, wherein each of the second tabs at least partially overlaps the second recess; a second temperature protection device having one end thereof electrically connected to one of the second tabs and the other end thereof electrically connected to the other second tab; and a pair of second connection units respectively electrically connected to the second electrode tabs. Each of the second tabs can be formed at least partially of nickel (Ni). The second temperature protection device can be welded to the second tabs. Each of the second tabs can have a facing surface facing an one surface of the PCB and the second temperature protection device can be welded to the facing surfaces of the second tabs.

Another aspect is a battery pack, comprising a first battery cell including a pair of first electrode tabs; a battery protection circuit module; and a frame accommodating the first battery cell and the battery protection circuit module, wherein the battery protection circuit module comprises: a printed circuit board (PCB); a pair of first tabs that are separated from each other, wherein each of the first tabs includes a portion overlapping the PCB, wherein the remaining portion of each of the first tabs protrudes from a first side of the PCB; a first temperature protection device having one end thereof electrically connected to one of the first tabs and the other end thereof electrically connected to the other first tab; and a pair of first connection units respectively electrically connected to the first electrode tabs.

Each of the first tabs can be formed at least partially of nickel (Ni). The area of the overlapping portion of each of the first tabs can be greater than the area of the remaining portion. The length of each of the first temperature protection devices can be greater than the smallest distance between the corresponding first tabs. The battery pack can further comprise a second battery cell including a pair of second electrode tabs, wherein the frame accommodates the second battery cell, and wherein the battery protection circuit module further comprises: a pair of second tabs that are separated from each other, wherein each of the second tabs includes a portion overlapping the PCB, wherein the remaining portion of each of the second tabs protrudes from a second side of the PCB opposing the first side; a second temperature protection device having one end thereof electrically connected to one of the second tabs and the other end thereof electrically connected to the other second tab; and a pair of second connection units respectively electrically connected to the second electrode tabs. Each of the second tabs cab ve formed at least partially of nickel (Ni). The area of the overlapping portion of each of the second tabs can be greater than the area of the remaining portion. The length of each of the second temperature protection devices can be greater than the smallest distance between the corresponding second tabs.

Another aspect is a battery pack, comprising a plurality of battery cells; a battery protection circuit module; and a frame accommodating the battery cells and the battery protection circuit module, wherein the battery protection circuit module comprises: a printed circuit board (PCB); a plurality of pairs of connection tabs, wherein each connection tab includes i) a facing surface facing the PCB, ii) a first portion overlapping the PCB, and iii) a second portion not overlapping the PCB; and a plurality of temperature protection devices respectively corresponding to the battery cells, wherein each of the temperature protection devices is electrically connected between a corresponding pair of connection tabs.

Each of the temperature protection devices can be attached to the facing surfaces of the corresponding connection tabs. Each of the battery cells can further includes a protrusion, wherein the frame comprises a plurality of ribs extending across the frame and respectively corresponding to the battery cells and wherein each of the ribs comprises a slot accommodating the corresponding protrusion. Each of the battery cells can include a pair of electrode tabs, wherein the battery protection circuit module further comprises a plurality of pairs of connection units respectively electrically connected to the battery cells, and wherein the temperature protection devices are electrically connected to the corresponding battery cells via the connection units.

According to at least one embodiment, it is possible to implement a battery protection circuit module having simplified manufacturing processes and a battery pack including the same.

DETAILED DESCRIPTION OF CERTAIN INVENTIVE EMBODIMENTS

Figure 1:
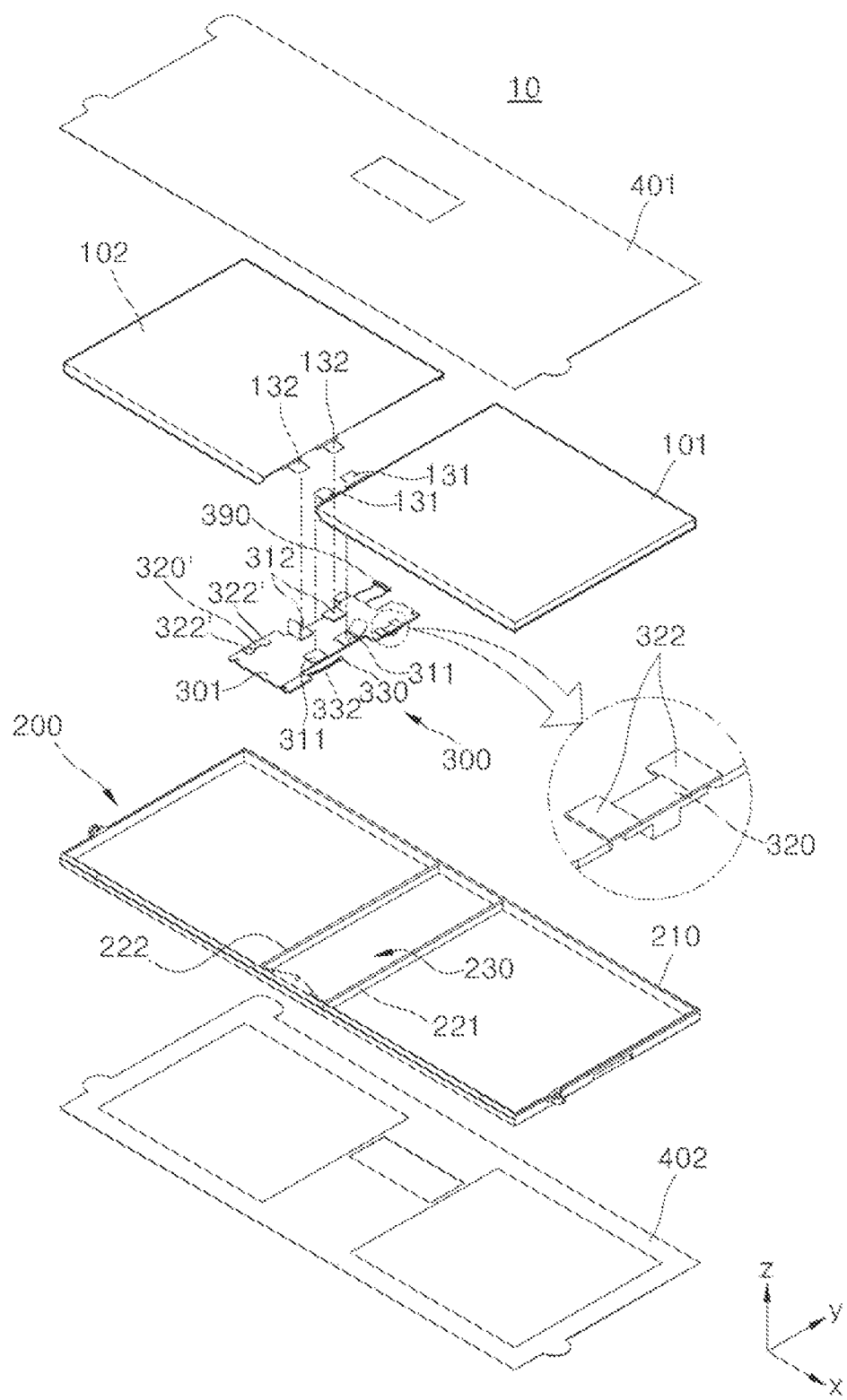
FIG. 1 is an exploded perspective view of a battery pack according to an embodiment.

Battery packs include a temperature protection device to prevent the battery packs from overheating and/or exploding due to overcharge, overdischarge, and/or overcurrent of battery cells contained therein. The inclusion of a temperature protection device in a standard battery pack increases the complexity of the manufacturing of the battery pack.

Embodiments of the described technology now will be described more fully hereinafter with reference to the accompanying drawings, in which elements of the described technology are shown. The described technology may, however, be embodied in many different forms and should not be construed as limited to the embodiments set forth herein. Rather, these embodiments are provided so that this disclosure will be thorough and complete, and will fully convey the scope of the described technology to one of ordinary skill in the art.

Like reference numerals refer to like elements throughout the specification.

It will be understood that when an element such as a layer, a film, a region, or a plate is referred to as being "on" another element, it can be directly on the other element, or intervening elements may also be present. In the drawings, the thicknesses of elements may be exaggerated for the sake of clarity.

In the embodiments, the x, y, and z axes are not limited to three axes in an orthogonal coordinate system and may be interpreted to have a broader meaning. For example, the x, y, and z axes may be orthogonal to each other or may refer to different directions that are not orthogonal to each other.

Figure 2:
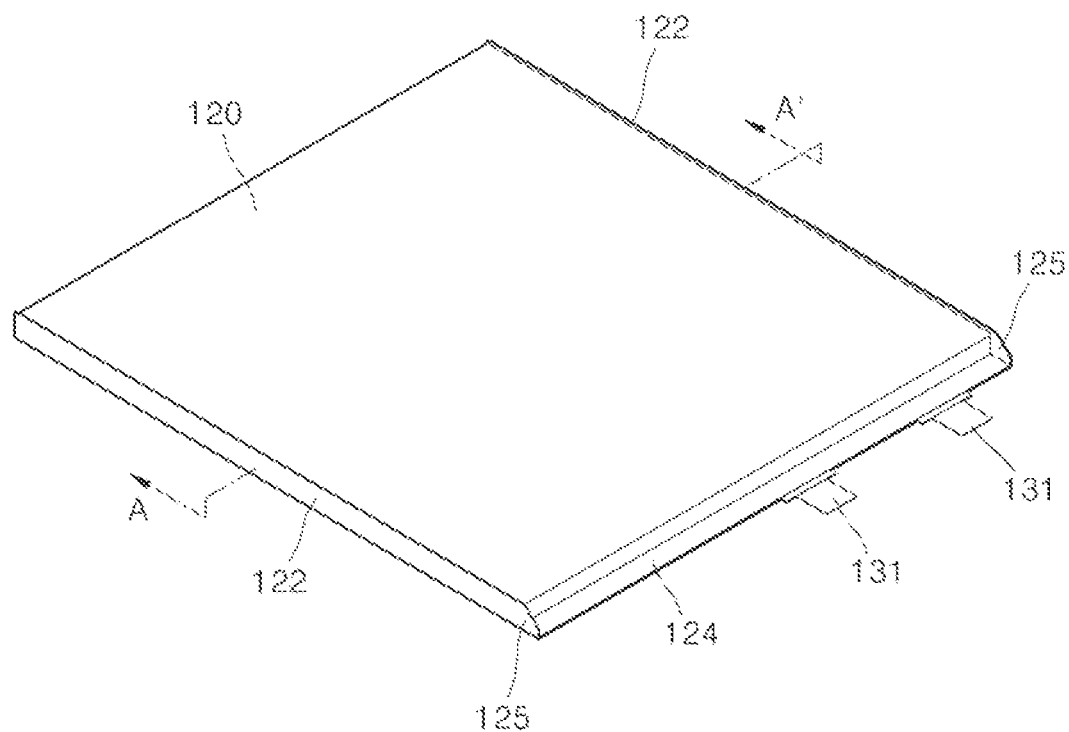
FIG. 2 is a perspective view of battery cells in the battery pack of FIG. 1.
Figure 3:
FIG. 3 is a cross-sectional view taken along line A-A' of FIG. 2.
Figure 4:
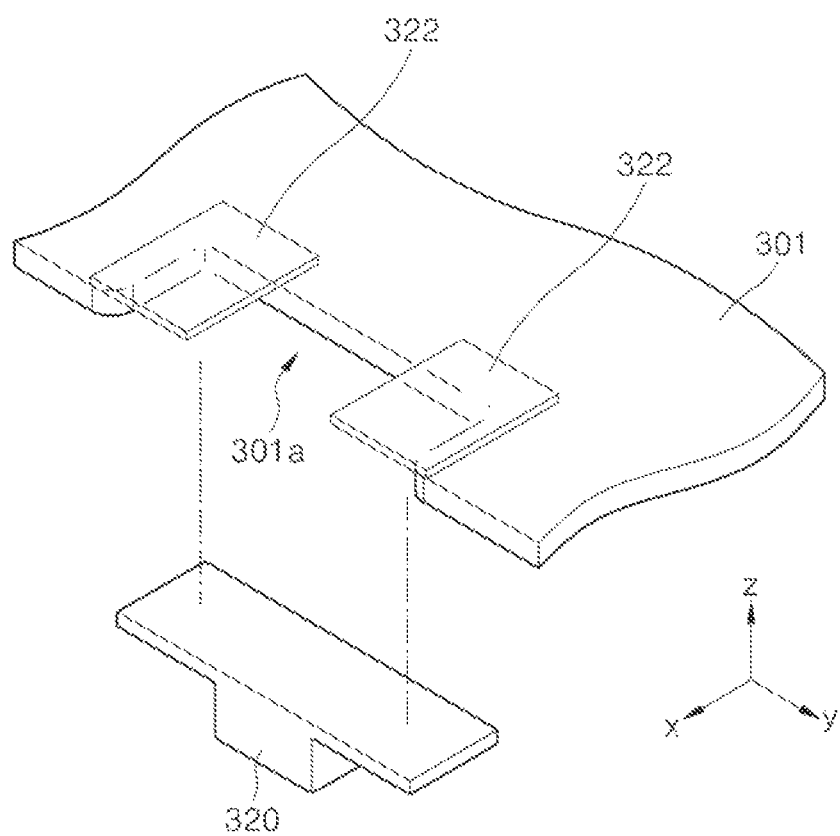
FIG. 4 is an exploded perspective view of a part of the protection circuit module in the battery pack of FIG. 1.

FIG. 1 is an exploded perspective view of a battery pack 10 according to an embodiment. FIG. 2 is a perspective view of a battery cell in the battery pack 10 of FIG. 1. FIG. 3 is a cross-sectional view taken along line A-A' of FIG. 2. FIG. 4 is an exploded perspective view of a part of the battery protection circuit module 300 in the battery pack 10 of FIG. 1.

Referring to FIGS. 1 to 3, the battery pack 10 includes a first battery cell 101, a second battery cell 102, a battery protection circuit module 300, and a frame 200. The frame 200 accommodates the first battery cell 101, the second battery cell 102, and the battery protection circuit module 300.

The first and second battery cells 101 and 102 may have similar structures. FIGS. 2 and 3 schematically illustrate the first battery cell 101. As illustrated in FIGS. 2 and 3, the first battery cell 101 includes an electrode assembly 110 and a pouch 120 for sealing the electrode assembly 110.

The electrode assembly 110 may be manufactured by stacking a positive electrode plate coated with a positive electrode active material, a negative electrode plate coated with a negative electrode active material, and a separator interposed between the positive electrode plate and the negative electrode plate and rolling the stacked positive electrode plate, negative electrode plate, and separator into a jellyroll shape. Alternately, the electrode assembly 110 may be manufactured by sequentially stacking the positive electrode plate, the separator, and the negative electrode plate a plurality of times.

As shown in the embodiment of FIGS. 2 and 3, the pouch 120 seals the electrode assembly 110 and includes a pair of side wing units 122 and a terrace unit 124 that can be formed, for example, by a melting process. Specifically, in one example, when the electrode assembly 110 is accommodated in an accommodating unit (not shown) including an accommodating space that can accommodate the electrode assembly 110, after a cover unit (not shown) having one side thereof continuous with the accommodating unit is folded over the accommodating unit, the accommodating unit and the cover unit are melted and combined at the edges of the accommodating space. Accordingly, the electrode assembly 110 can be sealed. In this example, the pair of side wing units 122 and the terrace unit 124 are formed at the edge of the accommodating space where the accommodating unit and the cover unit are combined.

The pair of side wing units 122 can be bent to run substantially parallel to the side surfaces of the first or second battery cell 101 or 102 or can be bent to contact the side surfaces of the first or second battery cell 101 or 102.

The pair of bent side wing units 122 extend to the terrace unit 124 and include extension units or protrusions 125 bent from the terrace unit 124.

The extension units 125 may be bent substantially perpendicular to the terrace unit 124 on the terrace unit 124. As a result, the pair of side wing units 122 are continuous with the extension units 125 and may be bent substantially perpendicular to the terrace unit 124. In addition, the extension units 125 may be inclined with respect to a longitudinal direction of the side wing units 122.

Additionally, a pair of first electrode tabs 131 are attached to the electrode assembly 110. The first electrode tabs 131 extends to the outside of the pouch 120 through the terrace unit 124 and are electrically connected to the battery protection circuit module 300.

The first and second battery cells 101 and 102 may have, for example, substantially square outlines. The frame 200 that accommodates the first and second battery cells 101 and 102 may be substantially rectangular. In addition, in the embodiment illustrated in FIG. 1 that the battery pack 10 includes the first and second battery cells 101 and 102. However, the described technology is not limited thereto, and the battery pack 10 may include one or more battery cells.

As illustrated in the embodiment of FIG. 1, when the first and second battery cells 101 and 102 are arranged in the battery pack 10, the first and second battery cells 101 and 102 are arranged so that the first electrode tabs 131 of the first battery cell 101 and the second electrode tabs 132 of the second battery cell 102 face each other. In this embodiment, the battery protection circuit module 300 is positioned between the first battery cell 101 and the second battery cell 102 that are arranged as described above.

The frame 200 includes a main frame 210 that forms the perimeter thereof and a first rib 221 and a second rib 222 that are separately formed across the main frame 210. The first and second ribs 221 and 222 create two accommodating regions for respectively accommodating the first and second battery cells 101 and 102 in the main frame 210. The space between the first and second ribs 221 and 222 is a settlement unit or battery protection circuit module accommodation space 230 in which the battery protection circuit module 300 is placed.

The frame 200 may be formed of an insulating material, for example, thermoplastic polymer resin. In addition, the frame 200 may be formed of an elastic material so that shocks can be dissipated when the battery pack 10 is dropped.

Figure 5:
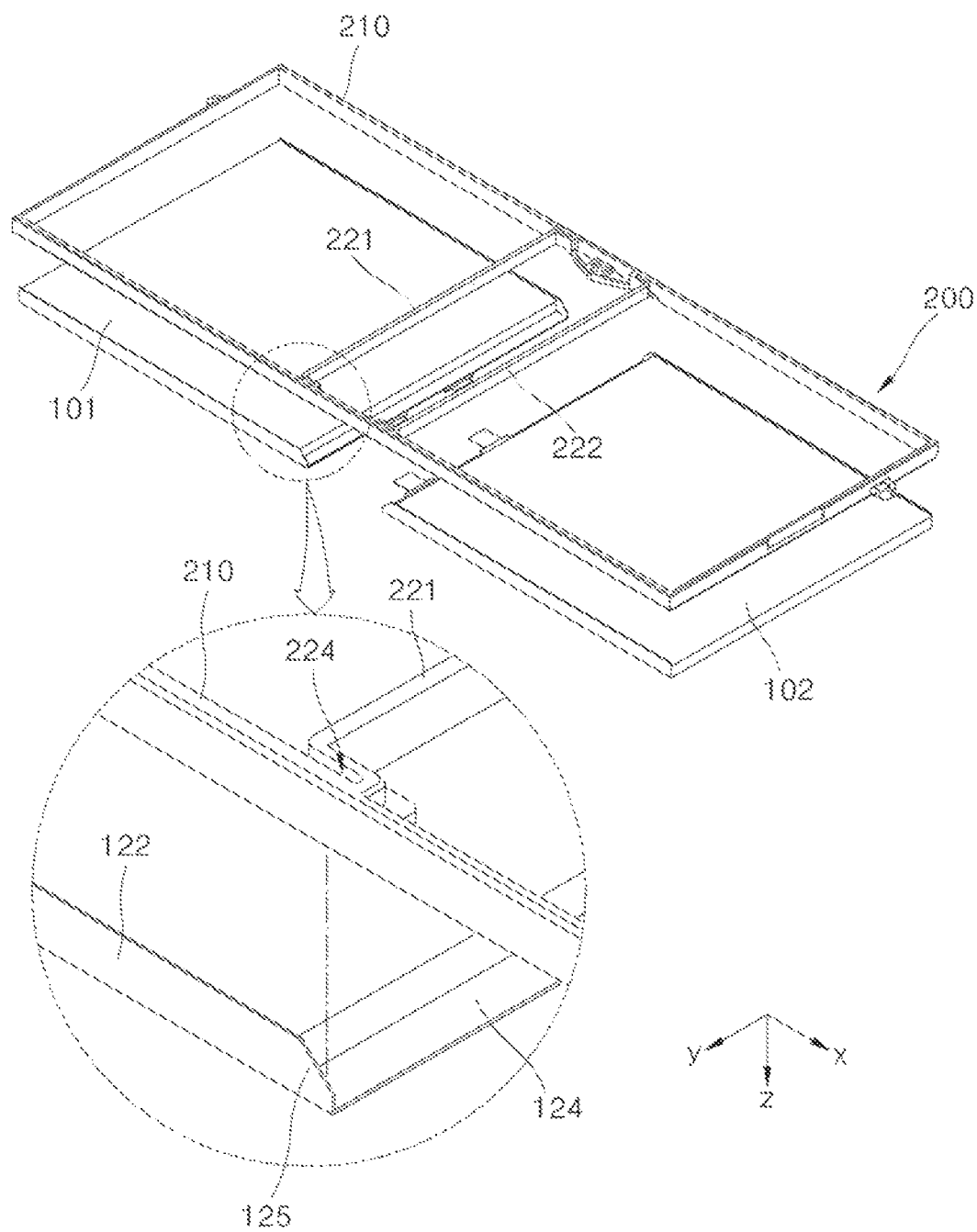
FIG. 5 is a perspective view illustrating a portion of the frame and the battery cells in the battery pack of FIG. 1.

Referring to FIG. 5, insertion units or slots 224, into which the above-described extension units 125 are inserted, are formed in the frame 200. This enables the assembly of the battery pack 10 to be simplified and the sizes of the first and second battery cells 101 and 102 can be increased, resulting in an increase in the capacity of the battery pack 10. This will be described in greater detail with reference to FIGS. 5 and 6.

The battery protection circuit module 300 is placed in the settlement unit 230 formed between the first and second ribs 221 and 222 of the frame 200 and is electrically connected to each of the first and second battery cells 101 and 102. The battery protection circuit module 300 includes a pair of first connection units 311 that can be welded to the pair of first electrode tabs 131 of the first battery cell 101 and a pair of second connection units 312 that can be welded to the pair of second electrode tabs 132 of the second battery cell 102. Thus, the battery protection circuit module 300 can be electrically connected to the first and second battery cells 101 and 102. The battery protection circuit module 300 includes a connector 390 for supplying power from the first and second battery cells 101 and 102 to an external electronic apparatus when required.

Although not shown, when the battery protection circuit module 300 is positioned between the first and second ribs 221 and 222, a cover (not shown) for covering the upper and lower surfaces of the battery protection circuit module 300 may be attached to the first and second ribs 221 and 222.

As shown in the FIG. 1 embodiment, the battery protection circuit module 300 includes a printed circuit board (PCB) 301, a pair of first tabs connection tabs 322, a pair of second tabs 322', a first temperature protection device 320, and a second temperature protection device 320'. The PCB 301 may be a common rigid PCB or a flexible PCB.

Referring now to FIG. 4, the PCB 301 has a first recess 301a cut inward (in a −x direction) in one side thereof. The pair of first tabs 322 are separately arranged. A portion of each of the pair of first tabs 322 overlaps the PCB 301 and the remainder of each of the pair of first tabs 322 is positioned in the first recess 301a. In some embodiments, the pair of first tabs 322 include nickel (Ni). One end of the first temperature protection device 320 is electrically connected to one of the first tabs 322 and the other end thereof is electrically connected to the other one of the first tabs 322. The pair of first tabs 322 may be electrically connected to wiring lines on the PCB 301 through, for example, welding. The first temperature protection device 320 may be connected to the first tabs 322 through welding.

The PCB 301 has a second recess (not shown) cut inward (in the +x direction) on the opposing side of the PCB 301 from the first recess 301a. The pair of second tabs 322' are separately arranged. A portion of each of the pair of second tabs 322' overlaps the PCB 301 and the remainder of each of the pair of second tabs 322' is positioned in the second recess. In some embodiments, the pair of second tabs 322' include Ni. One end of the second temperature protection device 320' is electrically connected to one of the second tabs 322' and the other end thereof is electrically connected to the other one of the second tabs 322'. The pair of second tabs 322' may be electrically connected to wiring lines on the PCB 301 through, for example, welding. The second temperature protection device 320' may be connected to the second tabs 322' through welding.

The first and second temperature protection devices 320 and 320' can prevent the battery pack 10 from overheating and/or exploding due to overcharge, overdischarge, and/or overcurrent of the first or second battery cells 101 or 102. The first and second temperature protection devices 320 and 320' can reversibly function as conductors or insulators based on the temperatures thereof to prevent the battery pack 10 from igniting or exploding due to overcurrent of in one of both of the first and second battery cells 101 and 102. The first and second temperature protection devices 320 and 320' may be, for example, polymer polycyclohexylene dimethylene terephthalate (PCT) in which conductive particles such as metal particles and/or carbon particles are dispersed into crystal polymer. However, the described technology is not limited thereto.

In some embodiments, the battery protection circuit module 300 may include a temperature sensor 330. The temperature sensor 330 generates an electrical signal from temperature information from a measuring position and transmit the generated electrical signal to the battery protection circuit module 300. For example, the temperature sensor 330 may be a thermistor. Specifically, a thermistor for generating an electrical signal corresponding to temperature of an object to be measured may be a resistive thermistor in which electrical resistance varies in accordance with temperature.

The temperature sensor 330 may be arranged to run substantially parallel to a longitudinal direction (a y axis direction) of the battery protection circuit module 300. The temperature sensor 330 may be adjacent to at least one side of the battery protection circuit module 300. In FIG. 1, the temperature sensor 330 is provided on the right side of the battery protection circuit module 300 to measure the temperature of the first battery cell 101. However, the described technology is not limited thereto, and the temperature sensor 330 may be provided on the left side of the battery protection circuit module 300.

In the embodiment of FIG. 1, the temperature sensor 330 monitors changes in temperature of the first battery cell 101 and can control charge and discharge of the first and second battery cells 101 and 103 in accordance with the monitoring result. For this purpose, the electrical signal generated by the temperature sensor 330 can be transmitted to the battery protection circuit module 300 by a cable 332 for connecting the temperature sensor 330 and the battery protection circuit module 300.

Referring to the embodiment of FIG. 1, the upper and lower surfaces of the frame 200 are open and labels 401 and 402 are respectively attached to the upper and lower surfaces of the frame 200.

In the battery pack 10 of FIG. 1, the first and second temperature protection devices 320 and 320' for preventing the battery pack 10 from overheating and/or exploding due to overcharge, overdischarge, and/or overcurrent of the first and second battery cells 101 and 102 are mounted on the battery protection circuit module 300. Therefore, since the first and second battery cells 101 and 102 only have to be connected to the battery protection circuit module 300 when manufacturing the battery pack 10, the battery pack 10 can be quickly and efficiently manufactured, remarkably improving the yield.

The first and second temperature protection devices 320 and 320' can be directly mounted on the first and second battery cells 101 and 102, respectively. Thereafter, the first electrode tabs 131 of the first battery cell 101 and the second electrode tabs 132 of the second battery cell 102 can be connected to the battery protection circuit module 300. However, in these implementations, when damage or defects occur in mounting the first and second temperature protection devices 320 and 320' on the first and second battery cells 101 and 102, respectively, the first and second battery cells 101 and 102 having relatively small manufacturing cost must be discarded. In addition, in mounting the first and second temperature protection devices 320 and 320' on the first and second battery cells 101 and 102, respectively, the first and second battery cells 101 and 102, which have a relatively large volume, must be handled.

However, in the battery pack 10 according to at least one embodiment, since the first and second temperature protection devices 320 and 320' the second temperature protection device 320' are directly mounted on the battery protection circuit module 300 having a smaller volume and manufacturing cost than that of each of the first and second battery cells 101 and 102, it is possible to remarkably improve the manufacturing yield of the battery pack 10 and to easily handle elements of the battery pack 10 during manufacturing.

Furthermore, since the part of each of the pair of first tabs 322 is arranged on one surface (a surface in a +z direction, refer to FIG. 4) of the PCB 301, the first temperature protection device 320 can be welded and connected to a facing surface (in a −z direction) of the pair of first tabs 322 that contacts the one surface (in the +z direction) of the PCB 301.

In the standard battery pack, the thickness of the PCB 301 is from about 0.8 mm to about 1.0 mm and the thickness of the first temperature protection device 320 is about 1.2 mm, which is greater than that of the PCB 301. When the first temperature protection device 320 is connected to a different surface (in the +z direction) from the surface (in the −z direction) that contacts each of the first tabs 322, the total thickness of the battery protection circuit module 300 is not less than the sum of the thickness of the PCB 301 and the thickness of the first temperature protection device 320. Accordingly, the total thickness of the battery protection circuit module 300 is increased when compared with at least one embodiment of the described technology.

However, the first temperature protection device 320 may be connected to the surface (in the −z direction) of each of the pair of first tabs 322 that contacts the one surface (in the +z direction) of the PCB 301 so that the total thickness of the battery protection circuit module 300 can be reduced.

Since the thickness of the first temperature protection device 320 is greater than that of the PCB 301 in some embodiments, as described above, the surface of the first temperature protection device 320 in an opposite direction (the −z direction) to the direction of the first tabs 322 protrudes above a surface of the PCB 301 in the opposite direction (the −z direction). Therefore, other electronic devices mounted on the PCB 301 can be mounted on the different surface (in the −z direction) from the one surface (in the +z direction) of the PCB 301 so that the total thickness of the battery protection circuit module 300 can be reduced.

As described above, in at least one embodiment, the battery protection circuit module 300 includes the pair of first connection units 311 that are welded to the pair of first electrode tabs 131 included in the first battery cell 101 and the pair of second connection units 312 that are welded to the pair of second electrode tabs 132 included in the second battery cell 102 to be electrically connected to the first battery cell 101 and the second battery cell 102. The negative electrodes of the first electrode tabs 131 of the first battery cell 101 and those of the second electrode tabs 132 of the second battery cell 102 may include Ni. In these embodiments, the negative electrodes of the first and second electrode tabs 131 and 132 can be easily attached to the first and second connection units 311 and 312, respectively, by resistance welding. However, when the positive electrodes of the first electrode tabs 131 of the first battery cell 101 and those of the second electrode tabs 132 of the second battery cell 102 include aluminum, the positive electrodes of the first electrode tabs 131 of the first battery cell 101 and those of the second electrode tabs 132 of the second battery cell 102 may not be correctly attached to the first connection units 311 and the second connection units 312, respectively, by resistance welding.

Therefore, the first and second connection units 311 and 312 to be connected to the positive electrodes of the first electrode tabs 131 of the first battery cell 101 and those of the second electrode tabs 132 of the second battery cell 102 are bent before being connected to the positive electrodes of the first electrode tabs 131 of the first battery cell 101 and those of the second electrode tabs 132 of the second battery cell 102 so that the first connection units 311 and the second connection units 312 can be connected to the positive electrodes of the first electrode tabs 131 of the first battery cell 101 and those of the second electrode tabs 132 of the second battery cell 102 to surround lower and upper surfaces of the positive electrodes of the first electrode tabs 131 of the first battery cell 101 and those of the second electrode tabs 132 of the second battery cell 102.

Figure 6:
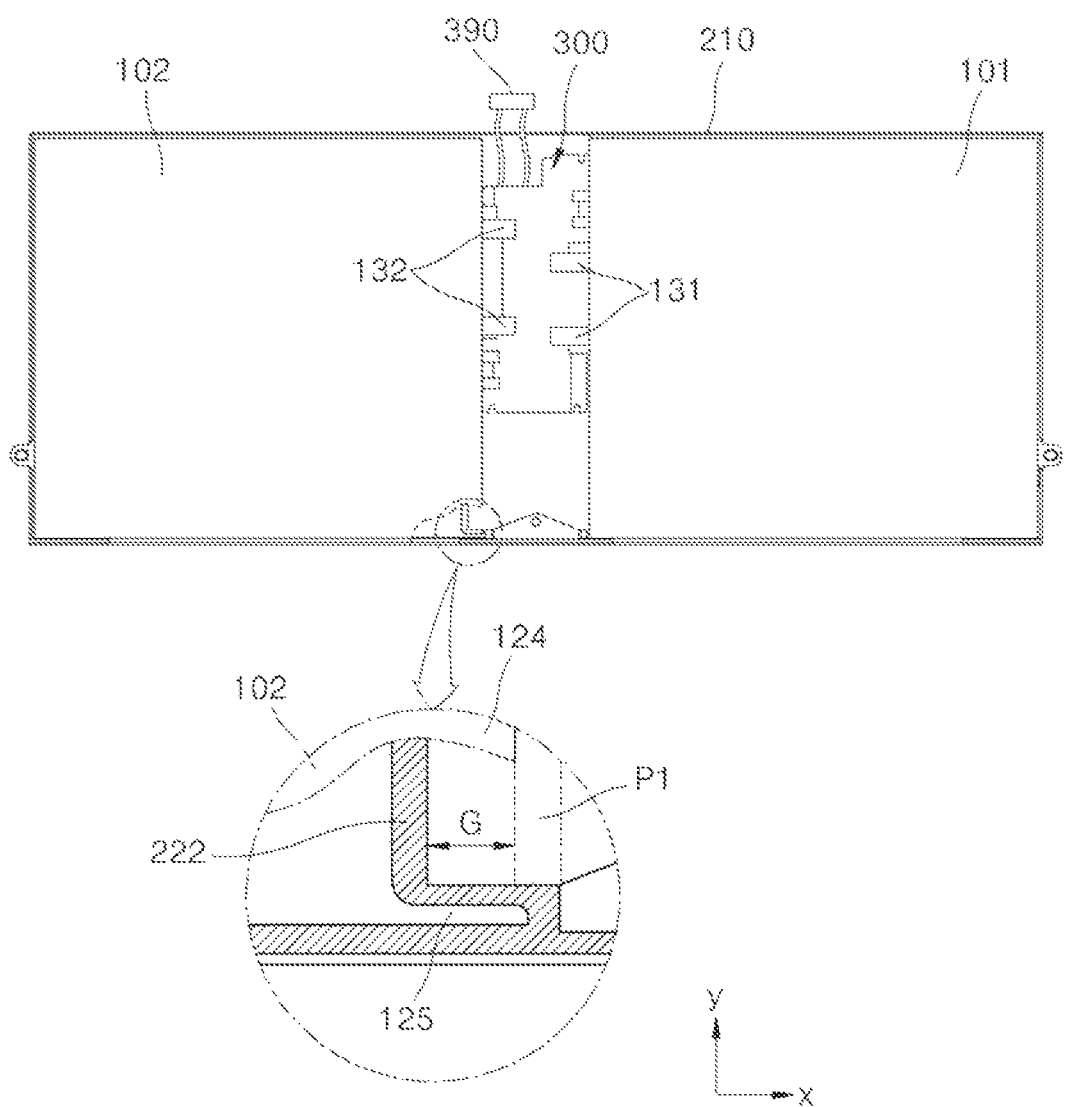
FIG. 6 is a plan view illustrating the battery cells and the protection circuit module assembled with the frame in the battery pack of FIG. 1.

FIG. 5 is a perspective view illustrating a portion of the frame 200 and the battery cell in the battery pack 10 of FIG. 1. FIG. 6 is a plan view illustrating the battery cell and the protection circuit module assembled with the frame in the battery pack 10 of FIG. 1.

First, referring to FIG. 5, the frame 200 includes the main frame 210 and the first and second ribs 221 and 222 that are separately formed across the main frame 210.

The first and second ribs 221 and 222 respectively accommodate the first and second battery cell 101 and 102 with the main frame 210 and form the insertion units or slots 224 into which the extension units 125 of the first battery cell 101 and the second battery cell 102 are inserted.

The insertion units 224 are formed in portions where the first rib 221 and the second rib 222 contact the main frame 210. That is, the insertion units 224 are formed in areas corresponding to the extension units 125 so that the extension units 125 perpendicular to the terrace units 124 may be inserted thereinto. In FIG. 5, since each of the first and second battery cells 101 and 102 includes two extension units 125, four insertion units 224 are formed in the frame 200.

As described above, when the insertion units 224 are formed in the first and second ribs 221 and 222, since combination positions of the first and second battery cells 101 and 102 can be easily set when the first and second battery cells 101 and 102 are combined with the frame 200, the battery pack (10 of FIG. 1) can be easily manufactured.

Referring to FIG. 5, the insertion unit 224 formed on one side of the first rib 221 that contacts the main frame 210 is enlarged to aid in describing the structure of the insertion units 224 in detail.

Referring to the enlarged view of the insertion unit 224 of FIG. 5, the insertion unit 224 is formed as a bend in the first rib 221. Specifically, the first rib 221 is bent to the longitudinal direction of the extension unit 125 of the first battery cell 101 to form the insertion unit 224.

Since the insertion unit 224 is also formed on the other side of the first rib 221 that contacts the main frame 210, the first rib 221 is bent to contact one side surface of the first battery cell 101 so that the first rib 221 is positioned on the terrace unit 124 of the first battery cell 101 when the first battery cell 110 is assembled with the frame 200.

Similarly, the second rib 222 is bent to the longitudinal direction of the extension unit 125 of the second battery cell 102 so that the second rib 222 is positioned on the terrace unit 124 of the second battery cell 102.

As described above, since the first rib 221 and the second rib 222 are respectively positioned on the terrace units 124 of the first battery cell 101 and the second battery cell 102, the size of the first battery cell 101 and the second battery cell 102 can be increased.

FIG. 6 illustrates a partially assembled battery pack 10 in which, after the battery protection circuit module 300 is accommodated in the frame (200 of FIG. 5), the first battery cell 101 and the second battery cell 102 are combined with the frame (200 of FIG. 5). In particular, FIG. 6 shows an enlarged view in which a lower portion of the second battery cell 102 is partially seen. Hereinafter, the description will refer to FIGS. 5 and 6.

As described above, the first and second ribs 221 and 222 are bent to form the insertion units 224 and are respectively positioned on the terrace units 124 of the first and second battery cells 101 and 102.

When the second rib 222 is not bent, the second rib 222 must be formed to include the extension unit 125 of the second battery cell 102 across the main frame 210. That is, when the second rib 222 is not bent, since the second rib 222 is positioned on a virtual line P1 marked as a dashed line in FIG. 6, in order to accommodate the second battery cell 102, the area of a region defined by the second rib 222 and the main frame 210 is increased. Similarly, when the first rib 221 is not bent, in order to accommodate the first battery cell 101, the area of the region defined by the first rib 221 and the main frame 210 is increased. Thus, due to the size of the battery protection circuit module 300 positioned between the first rib 221 and the second rib 222, the overall size of the battery pack 10 is increased.

However, according to at least one embodiment, since the first and second ribs 221 and 222 are bent to be respectively positioned on the terrace units 124 of the first and second battery cells 101 and 102 a sufficient area to accommodate the battery protection circuit module 300 can be formed between the first and second ribs 221 and 222. Therefore, it is possible to prevent the size of the battery pack 10 from increasing.

The description above means that the size of the first and second battery cells 101 and 102 included in the battery pack 10 can be increased while maintaining the size of the battery pack 10 due to the structure of the battery pack 10 according to at least one embodiment. As a result, the capacity of the battery pack 10 is correspondingly increased.

In addition, according to at least one embodiment, since the insertion units 224, into which the extension units 125 are inserted, are formed in the first and second ribs 221 and 222 so that the combination positions of the first and second battery cells 101 and 102 can be easily set when the first and second battery cells 101 and 102 are combined with the frame 200, the battery pack 10 can be easily manufactured.

Figure 7:
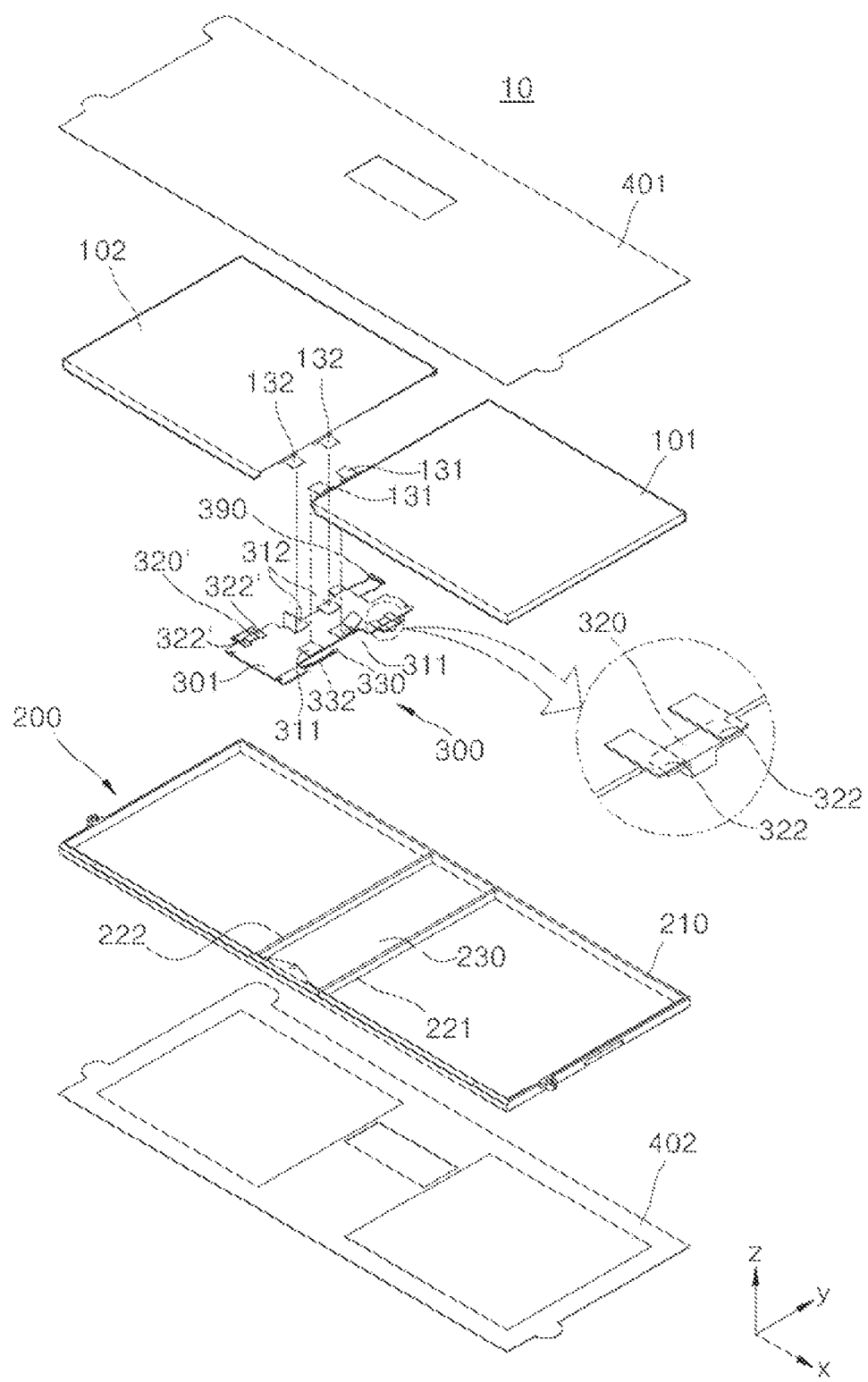
FIG. 7 is an exploded perspective view of a battery pack according to another embodiment.
Figure 8:
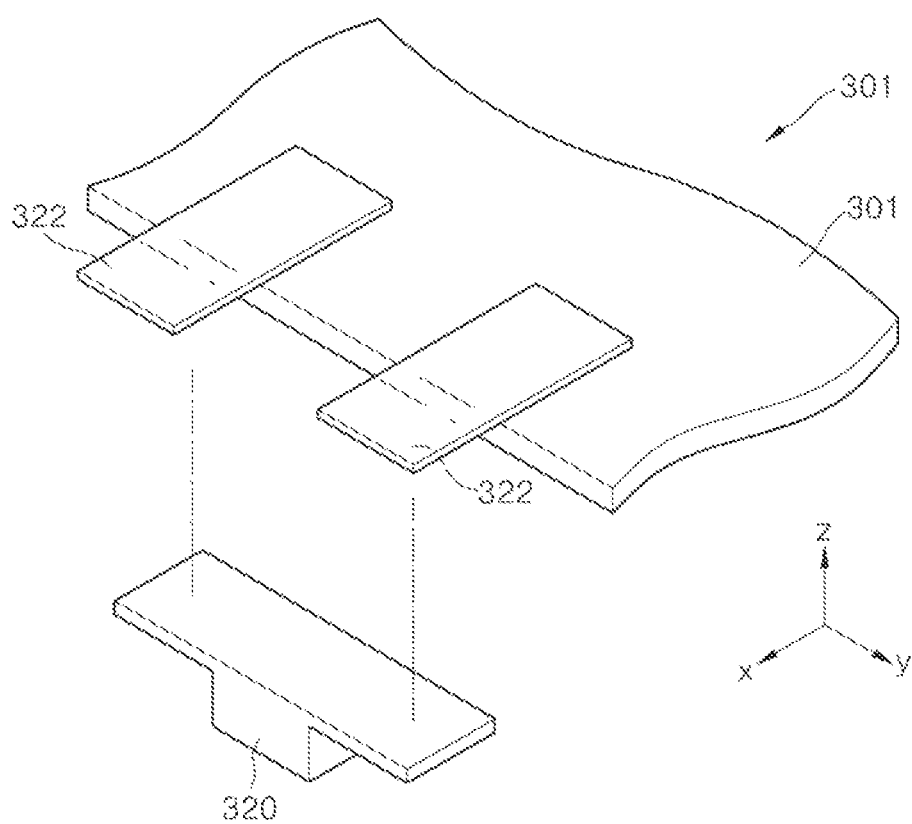
FIG. 8 is an exploded perspective view of a part of the protection circuit module in the battery pack of FIG. 7.

FIG. 7 is an exploded perspective view of a battery pack 10 according to another embodiment. FIG. 8 is an exploded perspective view of a portion of the protection circuit module in the battery pack of FIG. 7.

The battery pack 10 of FIGS. 7 and 8 is different from the battery pack 10 described above with reference to FIG. 1 in that the PCB 301 of the battery protection circuit module 300 does not have first and second recesses.

A portion of each of the pair of first tabs 322 overlaps the PCB 301 on one side (at an edge in the +x direction) of the PCB 301 and the remainder of each of the pair of first tabs 322 protrudes (in the +x direction) from the PCB 301. A portion of each of the pair of second tabs 322' overlaps the PCB 301 on the other side (at an edge in the −x direction) of the PCB 301 and the remainder of each of the pair of second tabs 322' protrudes (in the −x direction) from the PCB 301. The first temperature protection device 320 is electrically connected to the first tabs 322 outside of the perimeter of the PCB 301. The second temperature protection device 320' is electrically connected to the second tabs 322' outside of the perimeter the PCB 301.

In the embodiment of FIGS. 7 and 8, the first and second temperature protection devices 320 and 320' are not mounted on the first and second battery cells 101 and 102 but are directly mounted on the battery protection circuit module 300. The other details, for example, that the first tabs 322 and the second tabs 322' include Ni and the directions, in which the first and second temperature protection devices 320 and 320' are mounted on the first and second tabs 322 and 322' are substantially the same as in the above-described embodiments.

So far, the battery pack 10 has been described. However, the described technology is not limited thereto. For example, the above-described battery protection circuit module 300 may be considered as belonging to the scope of the described technology.

It should be understood that the exemplary embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope of the present invention as defined by the following claims.

What is claimed is:

1. A battery pack, comprising:
 a first battery cell including a pair of first electrode tabs;
 a battery protection circuit module; and
 a frame accommodating the first battery cell and the battery protection circuit module,
 wherein the battery protection circuit module comprises:
  a printed circuit board (PCB) having a first recess formed in a first side thereof;
  a pair of first tabs that are separated from each other, wherein each of the first tabs includes a first portion that overlaps the PCB and a second portion that overlaps the first recess, each of the first tabs having a facing surface facing one surface of the PCB;
  a first temperature protection device having one end thereof electrically connected to one of the first tabs and the other end thereof electrically connected to the other first tab, the first temperature protection device being welded to the facing surfaces of the first tabs such that at least a portion of the first temperature protection device is positioned in the first recess; and
  a pair of first connection units respectively electrically connected to the first electrode tabs, the first connection units being arranged on the one surface of the PCB.

2. The battery pack of claim 1, wherein each of the first tabs is formed at least partially of nickel (Ni).

3. The battery pack of claim 1, further comprising a second battery cell including a pair of second electrode tabs, wherein the PCB has a second recess formed in a second side thereof opposing the first side, wherein the frame accommodates the second battery cell, and wherein the battery protection circuit module further comprises:
 a pair of second tabs that are separated from each other, wherein each of the second tabs at least partially overlaps the second recess;
 a second temperature protection device having one end thereof electrically connected to one of the second tabs and the other end thereof electrically connected to the other second tab; and
 a pair of second connection units respectively electrically connected to the second electrode tabs.

4. The battery pack of claim 3, wherein each of the second tabs is formed at least partially of nickel (Ni).

5. The battery pack of claim 3, wherein the second temperature protection device is welded to the second tabs.

6. The battery pack of claim 5, wherein each of the second tabs has a facing surface facing an one surface of the PCB, and wherein the second temperature protection device is welded to the facing surfaces of the second tabs.

7. A battery pack, comprising:
 a first battery cell including a pair of first electrode tabs;
 a battery protection circuit module; and
 a frame accommodating the first battery cell and the battery protection circuit module,
 wherein the battery protection circuit module comprises:
  a printed circuit board (PCB);
  a pair of first tabs that are separated from each other, wherein each of the first tabs includes a first portion that overlaps the PCB and a second portion that protrudes from a first side of the PCB, each of the first tabs having a facing surface facing a first surface of the PCB;
  a first temperature protection device having one end thereof electrically connected to one of the first tabs and the other end thereof electrically connected to the other first tab, the first temperature protection device being welded to the facing surfaces of the first tabs such that the first temperature protection device protrudes from a second surface of the PCB opposing the first surface of the PCB; and
  a pair of first connection units respectively electrically connected to the first electrode tabs, the first connection units being arranged on the first surface of the PCB.

8. The battery pack of claim 7, wherein each of the first tabs is formed at least partially of nickel (Ni).

9. The battery pack of claim 7, wherein the area of the first portion of each of the first tabs is greater than the area of the second portion.

10. The battery pack of claim 7, further comprising a second battery cell including a pair of second electrode tabs, wherein the frame accommodates the second battery cell, and wherein the battery protection circuit module further comprises:
 a pair of second tabs that are separated from each other, wherein each of the second tabs includes a portion overlapping the PCB, wherein the remaining portion of each of the second tabs protrudes from a second side of the PCB opposing the first side;
 a second temperature protection device having one end thereof electrically connected to one of the second tabs and the other end thereof electrically connected to the other second tab; and
 a pair of second connection units respectively electrically connected to the second electrode tabs.

11. The battery pack of claim 10, wherein each of the second tabs is formed at least partially of nickel (Ni).

12. The battery pack of claim 10, wherein the area of the overlapping portion of each of the second tabs is greater than the area of the remaining portion.

13. The battery pack of claim 10, wherein each of the second tabs has a facing surface facing one surface of the PCB, and wherein the second temperature protection device is welded to the facing surfaces of the second tabs.

14. A battery pack, comprising:
 a plurality of battery cells;
 a battery protection circuit module; and
 a frame accommodating the battery cells and the battery protection circuit module,
 wherein the battery protection circuit module comprises:
  a printed circuit board (PCB);

a plurality of pairs of connection tabs, wherein each connection tab includes i) a facing surface facing a first surface of the PCB, ii) a first portion overlapping the PCB, and iii) a second portion not overlapping the PCB; and a plurality of temperature protection devices respectively corresponding to the battery cells, wherein each of the temperature protection devices is attached to the facing surfaces of a corresponding pair of connection tabs such that each of the temperature protection devices protrudes from a second surface of the PCB opposing the first surface of the PCB.

15. The battery pack of claim 14, wherein each of the battery cells further includes a protrusion, wherein the frame comprises a plurality of ribs extending across the frame and respectively corresponding to the battery cells, and wherein each of the ribs comprises a slot accommodating the corresponding protrusion.

16. The battery pack of claim 14, wherein each of the battery cells includes a pair of electrode tabs, wherein the battery protection circuit module further comprises a plurality of pairs of connection units respectively electrically connected to the battery cells, and wherein the temperature protection devices are electrically connected to the corresponding battery cells via the connection units.

* * * * *